(12) United States Patent
Kim

(10) Patent No.: US 7,626,157 B2
(45) Date of Patent: Dec. 1, 2009

(54) IMAGE SENSOR INCLUDING MICROLENS HAVING SIZES DIFFERING ACCORDING TO DEPOSITION OF COLOR FILTER ARRAY

(75) Inventor: Sang Sik Kim, Suwon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 11/319,600

(22) Filed: Dec. 29, 2005

(65) Prior Publication Data
US 2006/0145057 A1 Jul. 6, 2006

(30) Foreign Application Priority Data
Dec. 30, 2004 (KR) ................. 10-2004-0117227

(51) Int. Cl.
H01J 3/14 (2006.01)
H01J 5/16 (2006.01)
(52) U.S. Cl. .................. 250/216; 250/226; 348/373
(58) Field of Classification Search ............ 250/208.1, 250/226, 216; 257/432, 294, 440, E27.133, 257/E27.134, 431, 436, 291; 348/265, 272, 348/340, 294, 273, 275, 278–280, 336; 359/619, 359/622
See application file for complete search history.

(56) References Cited
U.S. PATENT DOCUMENTS

| 5,466,926 | A * | 11/1995 | Sasano et al. ............ 250/216 |
| 6,271,900 | B1 * | 8/2001 | Li ........................... 349/95 |
| 6,436,265 | B1 * | 8/2002 | Shimada et al. .......... 205/125 |
| 6,632,342 | B1 * | 10/2003 | Teshima et al. ........... 205/118 |
| 6,638,786 | B2 * | 10/2003 | Yamamoto ................ 438/57 |
| 7,126,099 | B2 * | 10/2006 | Hsu et al. ................. 348/273 |
| 2002/0140832 | A1 * | 10/2002 | Summa .................... 348/273 |
| 2005/0003659 | A1 * | 1/2005 | Markowitz et al. ....... 438/641 |
| 2005/0110104 | A1 * | 5/2005 | Boettiger et al. .......... 257/432 |

FOREIGN PATENT DOCUMENTS

| CN | 1445816 A | 1/2003 |
| CN | 10501507 | 6/2004 |
| KR | 10-2003-0010148 A | 2/2003 |

\* cited by examiner

Primary Examiner—Thanh X Luu
Assistant Examiner—Francis M Legasse, Jr.
(74) Attorney, Agent, or Firm—McKenna Long & Aldridge LLP

(57) ABSTRACT

A image sensor has a plurality of microlens disposed across an image area in which centrally disposed red pixels are provided with smaller microlenses and peripherally disposed red pixels are provided with larger microlenses. The size differential, which amounts to a small percentage to compensate for a refractivity differential per wavelength of incident light across the image area, prevents the generation of a reddish effect in an output image. The image sensor includes a color filter array having separate color filters including a long-wavelength filter, and a plurality of microlenses respectively formed on the separate color filters, wherein the microlenses corresponding to the long-wavelength filter have relative sizes differing according to disposition with respect to the color filter array.

6 Claims, 4 Drawing Sheets

IMAGE SENSOR INCLUDING MICROLENS HAVING SIZES DIFFERING ACCORDING TO DEPOSITION OF COLOR FILTER ARRAY

This application claims the benefit of Korean Patent Application No. 10-2004-0117227, filed on Dec. 30, 2004, which is hereby incorporated by reference for all purposes as if fully set forth herein.

BACKGROUND OF THE INVENTION

1. Field of the Invention

The present invention relates to an image sensor, and more particularly, to an image sensor that prevents the generation of a reddish effect in an output image.

2. Discussion of the Related Art

Image sensors are semiconductor devices for converting an optical image to an electrical signal and include CMOS image sensors having a number of metal-oxide-semiconductor (MOS) transistors, corresponding to the number of pixels, integrated on a single chip with peripheral circuitry. The circuitry sequentially outputs the electrical signals of the MOS transistors. CMOS image sensors use complimentary MOS technology to decrease feature size, power consumption, and fabrication costs and are applicable to such products as digital cameras, cellular telephones, personal digital assistants, notebook computers, bar-code readers, and toys. A CMOS image sensor largely includes a signal processing chip which includes an array of photodiodes provided with an amplifier, an analog-to-digital converter, an internal voltage regulator, a timing generator, and digital logic circuitry.

To enhance the photosensitivity of a CMOS image sensor, its fill factor may be improved; that is, the photodiode area is increased with respect to the area of the device itself. Increase of the fill factor is limited, however, by the presence of the associated logic and signal processing circuitry of each photodiode. Enhanced photosensitivity may also be achieved by focusing incident light, which is otherwise deflected, onto, for example, a microlens provided to each photodiode. The microlens should concentrate the incident light onto the photodiode and away from the adjacent areas where there is no photodiode surface.

An image sensor used for, as an example, a mobile phone, is included in an optical module, which is compactly fabricated according to a viewing angle (AOV) of typically about 55° to 65°, such that the light from a light source or object is obliquely incident to the edges of an image area, typically at an angle of 30° or less, as shown in FIG. 1. The angle of view determines the size of each color filter of a color filter array as well as their corresponding microlenses, all of which are smaller toward the center of the image area of the array. That is, direct light that is incident at the center of the image area may concentrate a visible light ray onto the corresponding photodiode, but the same light source may be obliquely incident at the edges of the image area, such that concentration differs according to color pixel due to a difference in refractivity per wavelength. That is, the refractivity of a ray of red light is smaller than the refractivity of a ray of green or blue light. This refractivity differential results in an output differential between an image area center and its edges, thereby imparting the generated image with an unwanted reddish hue.

SUMMARY OF THE INVENTION

Accordingly, the present invention is directed to an image sensor that substantially obviates one or more problems due to limitations and disadvantages of the related art.

An advantage of the present invention is to provide an image sensor, which prevents the generation of a reddish effect in an output image.

An advantage of the present invention is to provide an image sensor, which enables a decrease in light concentration so that a uniform image can be obtained with a desired dynamic range.

Additional features and advantages of the invention will be set forth in the description which follows, and will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the invention, as embodied and broadly described, an image sensor includes a color filter array including separate color filters for respectively filtering light according to wavelength, wherein the separate color filters include a long-wavelength filter, and a plurality of microlenses respectively formed on the separate color filters of the color filter array, the microlenses corresponding to the long-wavelength filter and having relative sizes differing according to disposition with respect to the color filter array.

In another aspect of the present invention, an image sensor includes a substrate having a central image region and a peripheral image region, a color filter array disposed in the central image region and the peripheral image region, said color filter array including separate color filters for respectively filtering light according to wavelength, wherein the separate color filters include a long-wavelength filter, and a plurality of microlenses respectively formed on the separate color filters of said color filter array, the microlenses corresponding to the long-wavelength filter and having sizes according to disposition across the substrate, wherein the respective sizes reduce from the peripheral image region to the central image region.

In another aspect of the present invention, a CMOS image sensor includes a plurality of photosensors for red light, green light, and blue light formed across a semiconductor substrate having a central image region and a peripheral image region, an insulating interlayer, a metal line, and a passivation layer sequentially formed on the photosensors, a red filter, a green filter, and a blue filter formed on the passivation layer to correspond to the plurality of photosensors, and a plurality of microlenses respectively formed on the red filter, the green filter, and the blue filter, wherein the microlens formed on the red filter of the central image region is smaller than the microlens formed on the red filter of the peripheral image region.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to exemplary embodiments of the present invention, examples of which are illustrated in the accompanying drawings. Wherever possible, like reference designations will be used throughout the drawings to refer to the same or similar parts.

An image sensor according to the present invention includes a plurality of photosensors, for example, photodiodes, for receiving red light, green light, and blue light, formed on a semiconductor substrate having a central image region and a peripheral image region. An insulating interlayer, a patterned metal layer, and a passivation layer may be formed on the photosensors. A color filter array is formed on the passivation layer, and a plurality of microlenses are formed on the color filter array. The color filter array and microlenses are formed, using CMOS technology, across the central image region and the peripheral image region of the semiconductor substrate, as shown in FIGS. 2A and 2B.

Figure 1:
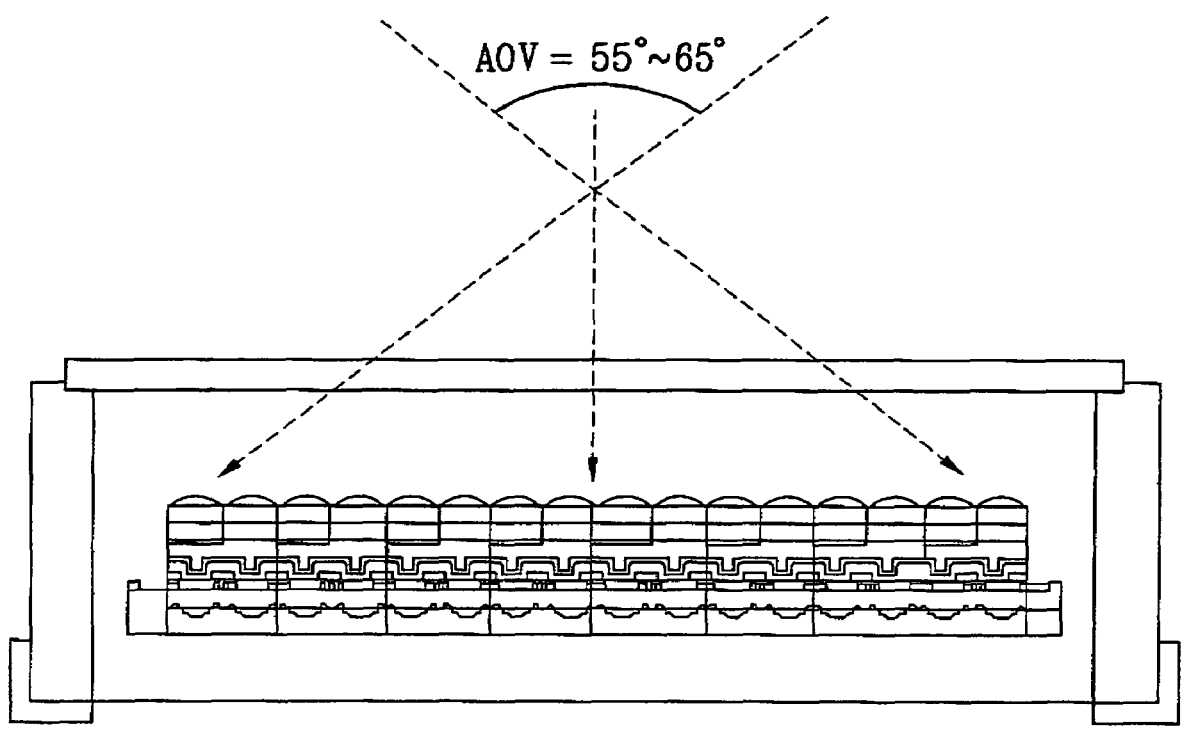
FIG. 1 is a diagram of an optical module of a related art image sensor.
Figure 2A:
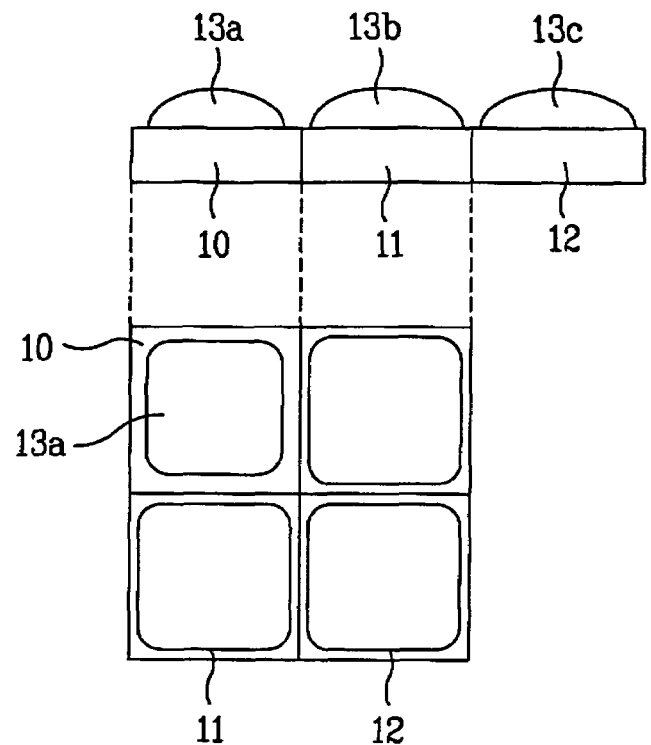
FIG. 2A is a cross-sectional view and a plan view of a central image area in an image sensor according to the present invention.
Figure 2B:
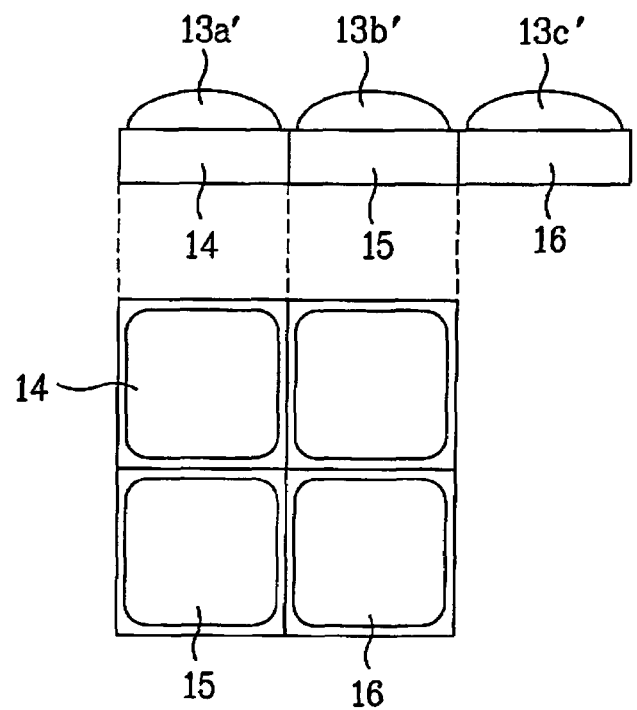
FIG. 2B is a cross-sectional view and a plan view of a peripheral image area in an image sensor according to the present invention.

As shown in FIG. 2A, a first green filter 11 is disposed in the central image region, adjacent a first red filter 10 and a first blue filter 12. A plurality of microlenses are respectively provided atop each color filter of the central image region. As shown in FIG. 2B, a second green filter 15 is disposed in the peripheral image region, adjacent a second red filter 14 and a second blue filter 16 . . . A plurality of microlenses are respectively provided atop each color filter of the peripheral image region. In FIGS. 2A and 2B, the first green filter 11 and the second green filter 15, and the first blue filter 12 and the second blue filter 16 are shorter-wavelength filters for filtering green and blue light, respectively. The first red filter 10 and the second red filter 14 filter red light and are thus long-wavelength filters.

According to the present invention, the microlenses corresponding to the long-wavelength filter have relative sizes differing according to disposition with respect to the respective regions of a semiconductor substrate. That is, the difference in relative microlens size is graduated across the substrate, reducing from the peripheral image region to the central image region. Thus, transmitted light energy is reduced accordingly. The color filter array includes separate color filters for respectively filtering light according to wavelength, namely, the shorter wavelength filters 11, 12, 15 and 16 and the long-wavelength filters 10 and 14.

Figure 3:
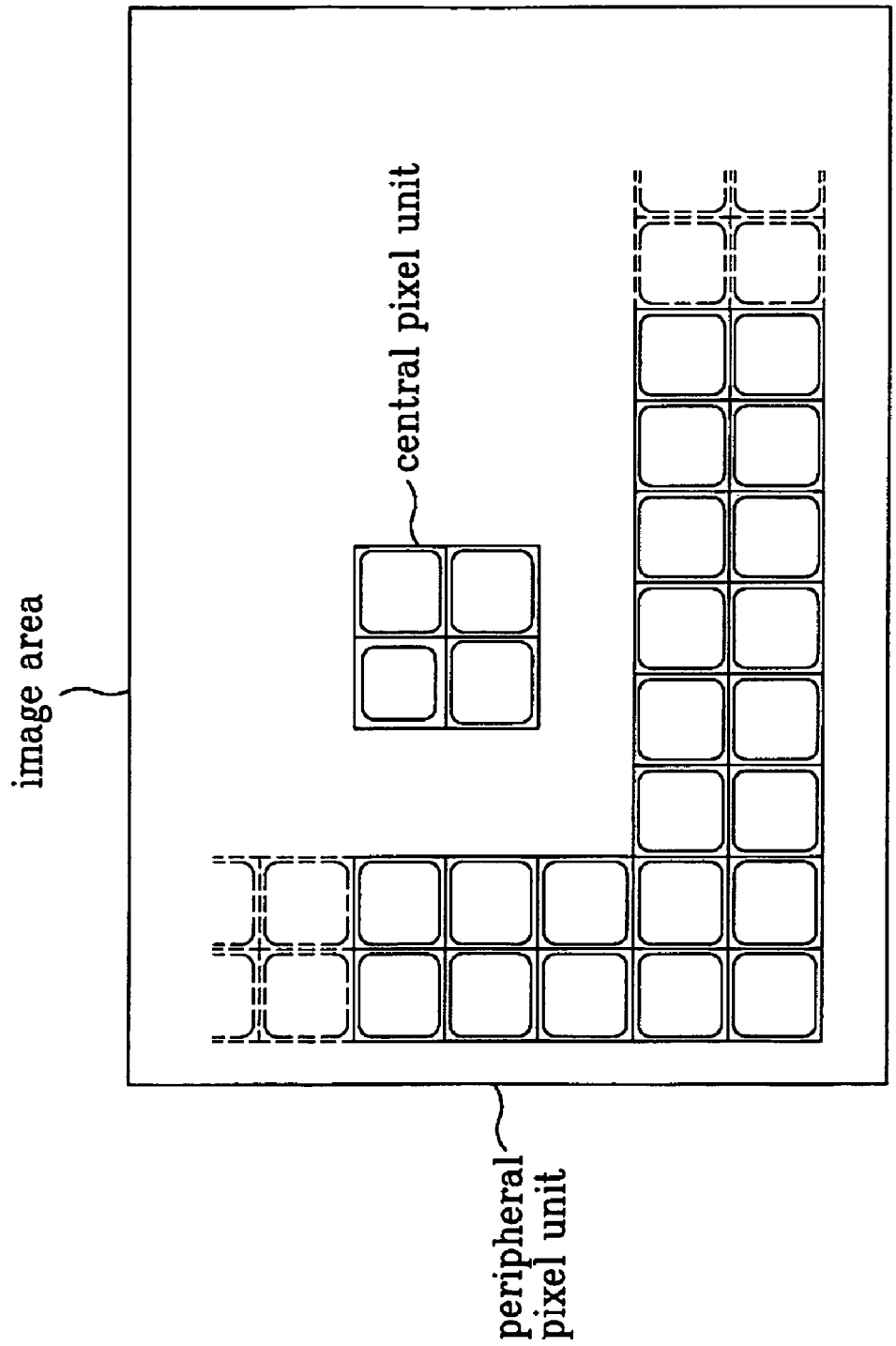
FIG. 3 is a diagram of an image area including an array of pixel units in an image sensor according to an exemplary embodiment of the present invention.
Figure 4:
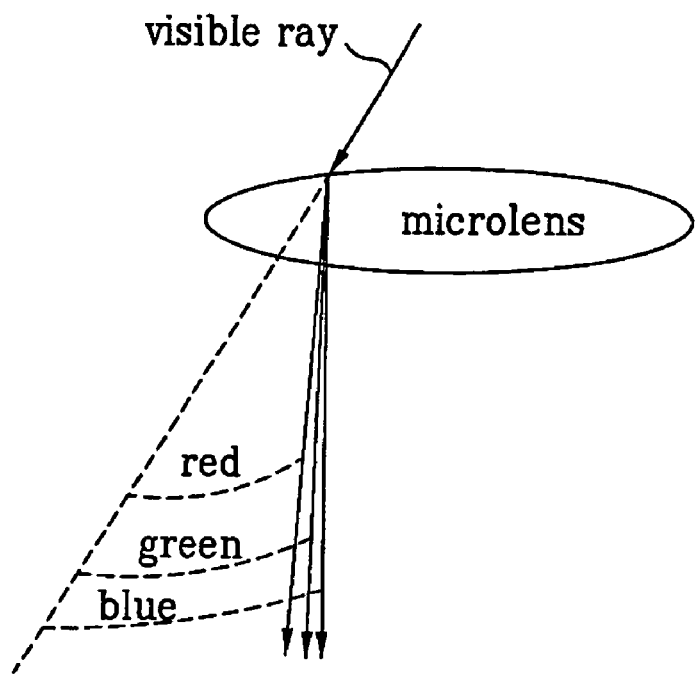
FIG. 4 is a diagram illustrating an example of refractivity according to the wavelength of light incident onto the microlens of an image sensor of the present invention.
Figure 5:
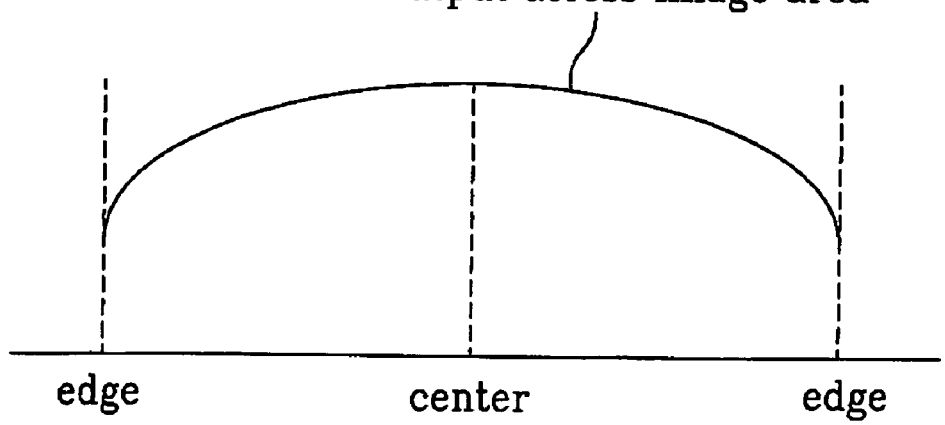
FIG. 5 is a diagram illustrating filter output versus image area.

Specifically, in the central region, a microlens 13a of a relatively small size is provided on the first red filter 10, and microlenses 13b and 13c of an equal but larger size are respectively provided for the green filter 11 and the blue filter 12. In the peripheral image region, microlenses 13a', 13b', and 13c' of a size corresponding to that of the microlenses 13b and 13c are respectively provided for the second red filter 14, the second green filter 15, and the second blue filter 16. That is, at the edges of peripheral image region, the microlenses 13a' is the same size as the microlenses 13b' and 13c'. Thus, the red central-region microlens 13a is smaller than the red peripheral-region microlens 13a'. The total size differential may be about 5%, and represents an amount that is graduated from the smallest, or most central, red-filter microlens of the central image region to the largest, or most remote, red-filter microlens of the peripheral image region. This arrangement is shown with reference to FIG. 3, which illustrates an array of pixel units in an image sensor according to an exemplary embodiment of the present invention. The graduation of red-filter microlens size according to image area disposition is based on a refractivity differential per wavelength of incident light, as shown in FIG. 4, and a filter output across the image area as shown in FIG. 5.

In the image sensor according to the present invention, the microlens of a red pixel provided at the center of an image area is smaller, according to a graduated scale, than the microlens of a red pixel provided at the edge of the image area. Thus, the generation of a reddish effect in an output image is thereby prevented. Thus, light concentration can be decreased so that a uniform image can be obtained. Therefore, by applying a digital signal processor to the image sensor of the present invention, a high-color-quality and high-performance image sensor can be realized by decreasing the red light signal in the center of the image area, so that a desired dynamic range can be maintained.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An image sensor, comprising:
    a color filter array including separate color filters for respectively filtering light according to wavelength, wherein the separate color filters include a long-wavelength filter; and
    a plurality of microlenses respectively formed on the separate color filters of said color filter array, the microlens corresponding to the long-wavelength filter having relative size differing according to its location on said color filter array and the microlenses corresponding to the other color filters having the same size across the color filter array,
    wherein said color filter array includes a central image region and a peripheral image region and wherein the microlens corresponding to the long-wavelength filter in the central image region is smaller in cross sectional area than the microlens corresponding to the long-wavelength filter in the peripheral image region.

2. The image sensor of claim 1, wherein the microlens corresponding to the long-wavelength filter in the central image region is 5% smaller in cross sectional area than the microlens corresponding to the long-wavelength filter in the peripheral image region.

3. The image sensor of claim 1, wherein the microlens corresponding to the long-wavelength filter in the central image region transmits less light energy than the microlens corresponding to the long-wavelength filter in the peripheral image region.

4. The image sensor of claim 1, wherein the separate color filters comprise a first color filter for filtering red light, a second color filter for filtering green light, and a third color filter for filtering blue light.

5. The image sensor of claim 1, wherein said color filter array and said plurality of microlenses are formed using CMOS technology.

6. An image sensor, comprising:

a substrate having a central image region and a peripheral image region;

a color filter array disposed in the central image region and the peripheral image region, said color filter array including separate color filters for respectively filtering light according to wavelength, wherein the separate color filters include a long-wavelength filter; and a plurality of microlenses respectively formed on the separate color filters of said color filter array, the microlens corresponding to the long-wavelength filter having size according to disposition across said substrate, wherein the respective size smaller in cross sectional area from the peripheral image region to the central image region, and the microlenses corresponding to the other color filters having the same size across said substrate.

* * * * *